(12) United States Patent
Wann et al.

(10) Patent No.: US 9,136,383 B2
(45) Date of Patent: Sep. 15, 2015

(54) CONTACT STRUCTURE OF SEMICONDUCTOR DEVICE

(75) Inventors: Clement Hsingjen Wann, Carmel, NY (US); Ling-Yen Yeh, Hsin-Chu (TW); Chi-Yuan Shih, Hsin-Chu (TW); Yen-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 75 days.

(21) Appl. No.: 13/571,201

(22) Filed: Aug. 9, 2012

(65) Prior Publication Data

US 2014/0042500 A1  Feb. 13, 2014

(51) Int. Cl.
| | |
|---|---|
| *H01L 29/49* | (2006.01) |
| *H01L 29/40* | (2006.01) |
| *H01L 29/78* | (2006.01) |
| *H01L 21/8234* | (2006.01) |
| *H01L 29/51* | (2006.01) |
| *H01L 21/8238* | (2006.01) |
| *H01L 29/417* | (2006.01) |
| *H01L 21/285* | (2006.01) |
| *H01L 21/762* | (2006.01) |
| *H01L 29/165* | (2006.01) |

(52) U.S. Cl.
CPC ...... *H01L 29/7848* (2013.01); *H01L 21/28525* (2013.01); *H01L 21/28568* (2013.01); *H01L 21/76224* (2013.01); *H01L 21/823431* (2013.01); *H01L 21/823807* (2013.01); *H01L 21/823814* (2013.01); *H01L 29/41791* (2013.01); *H01L 29/49* (2013.01); *H01L 29/4958* (2013.01); *H01L 29/518* (2013.01); *H01L 29/785* (2013.01); *H01L 29/165* (2013.01); *H01L 2029/7858* (2013.01); *H01L 2924/0002* (2013.01)

(58) Field of Classification Search
USPC ............ 257/327, 328, 382, 383, 750, E21.41, 257/E21.507, E29.267; 438/157, 283, 300, 438/586, 765
See application file for complete search history.

(56) References Cited

U.S. PATENT DOCUMENTS

| | | | |
|---|---|---|---|
| 7,078,300 B2 | 7/2006 | Gousev et al. | |
| 8,012,839 B2 * | 9/2011 | Liu et al. | ........................ 438/300 |
| 8,110,499 B2 * | 2/2012 | Kang et al. | .................... 438/664 |
| 2004/0026736 A1 * | 2/2004 | Grupp et al. | .................. 257/330 |
| 2006/0157687 A1 | 7/2006 | Doyle et al. | |
| 2009/0280641 A1 | 11/2009 | Kang et al. | |
| 2010/0148217 A1 | 6/2010 | Simonelli et al. | |
| 2010/0155846 A1 * | 6/2010 | Mukherjee et al. | ........... 257/365 |
| 2011/0006348 A1 | 1/2011 | Cho et al. | |
| 2011/0079829 A1 * | 4/2011 | Lai et al. | ........................ 257/288 |
| 2011/0254122 A1 * | 10/2011 | Noda et al. | .................... 257/530 |
| 2011/0272739 A1 | 11/2011 | Lee et al. | |
| 2012/0168830 A1 | 7/2012 | Usuda et al. | |
| 2013/0022930 A1 * | 1/2013 | Clevenger et al. | ............ 430/326 |

FOREIGN PATENT DOCUMENTS

| | | | |
|---|---|---|---|
| KR | 1020070089743 A | 8/2007 | |
| KR | 20090116360 A | 11/2009 | |
| KR | 20110036505 A | 4/2011 | |
| KR | 1020110123194 A | 11/2011 | |

* cited by examiner

*Primary Examiner* — Zandra Smith
*Assistant Examiner* — Molly Reida
(74) *Attorney, Agent, or Firm* — Slater & Matsil, L.L.P.

(57) ABSTRACT

The disclosure relates to a semiconductor device. An exemplary structure for a contact structure for a semiconductor device comprises a substrate comprising a major surface and a cavity below the major surface; a strained material in the cavity, wherein a lattice constant of the strained material is different from a lattice constant of the substrate; a Ge-containing dielectric layer over the strained material; and a metal layer over the Ge-containing dielectric layer.

20 Claims, 12 Drawing Sheets

FIG. 12

CONTACT STRUCTURE OF SEMICONDUCTOR DEVICE

TECHNICAL FIELD

The disclosure relates to integrated circuit fabrication, and more particularly to a semiconductor device with a contact structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, silicide formation on strained materials causes high contact resistance of source/drain regions of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12 are perspective and cross-sectional views of a semiconductor device comprising a contact structure at various stages of fabrication according to various embodiments of the present disclosure.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
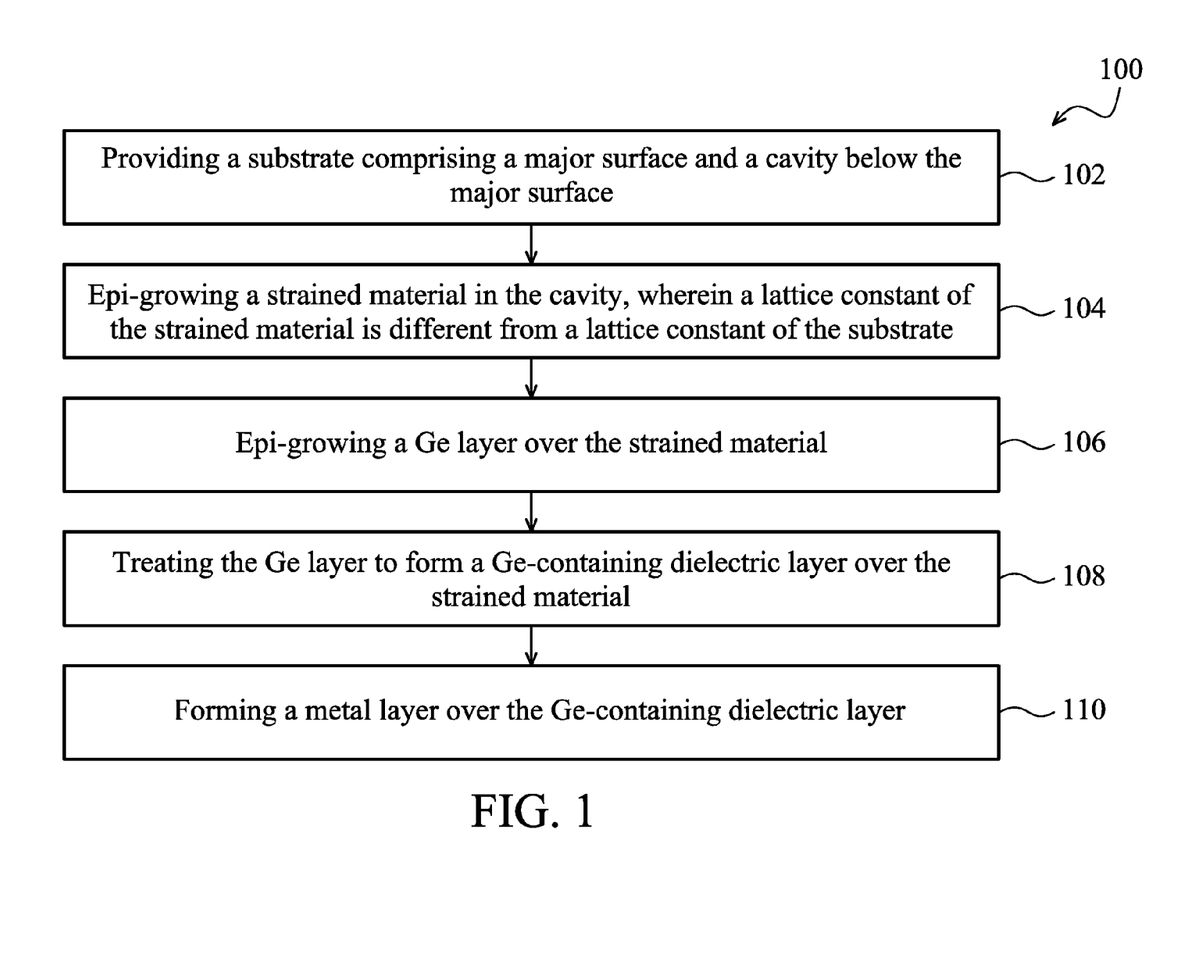
FIG. 1 is a flowchart illustrating a method of fabricating a contact structure of a semiconductor device according to various aspects of the present disclosure.

Referring to FIG. 1, illustrated is a flowchart of a method 100 of fabricating a contact structure of a semiconductor device according to various aspects of the present disclosure. The method 100 begins with step 102 in which a substrate comprising a major surface and a cavity below the major surface is provided. The method 100 continues with step 104 in which a strained material is epitaxial-grown in the cavity, wherein a lattice constant of the strained material is different from a lattice constant of the substrate. The method 100 continues with step 106 in which a Ge layer is epitaxial-grown over the strained material. The method 100 continues with step 108 in which the Ge layer is treated to form a Ge-containing dielectric layer over the strained material. The method 100 continues with step 110 in which a metal layer is formed over the Ge-containing dielectric layer. The discussion that follows illustrates embodiments of semiconductor devices that can be fabricated according to the method 100 of FIG. 1.

FIGS. 2A-12 are perspective and cross-sectional views of a semiconductor device 200 comprising a contact structure 230 at various stages of fabrication according to various embodiments of the present disclosure. Embodiments such as those described herein relate to a fin field effect transistor (FinFET). The FinFET refers to any fin-based, multi-gate transistor. In some alternative embodiments, embodiments such as those described herein relate to a planar metal-oxide-semiconductor field effect transistor (planar MOSFET). The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2A through 12 are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2A:
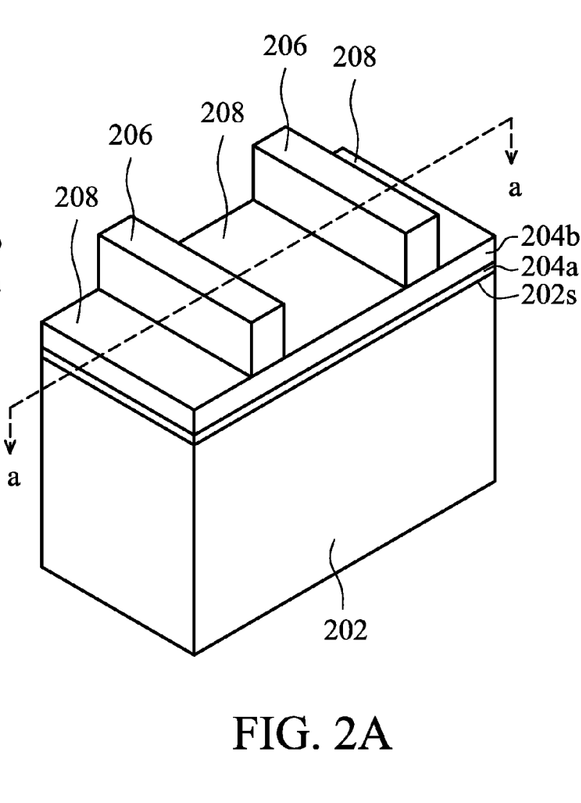
Figure 2B:
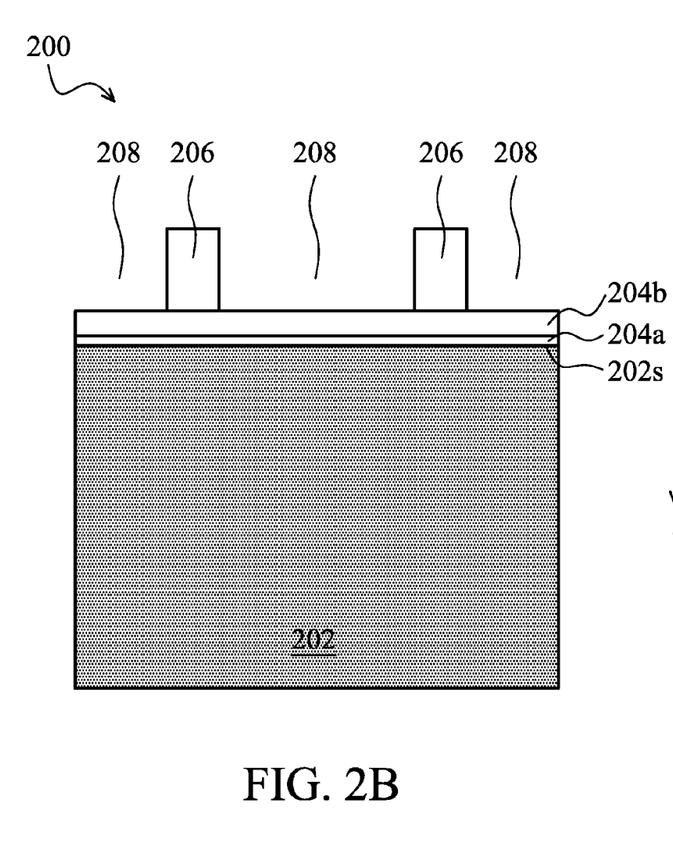

Referring to FIGS. 2A and 2B, and step 102 in FIG. 1, a substrate 202 is provided. FIG. 2A is a perspective view of the semiconductor device 200 having a substrate 202 at one of the various stages of fabrication according to an embodiment, and FIG. 2B is a cross-sectional view of semiconductor device 200 taken along the line a-a of FIG. 2A. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type MOSFET (nMOSFET), or alternatively configured for a p-type MOSFET (pMOSFET).

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on a major surface 202s of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3A:
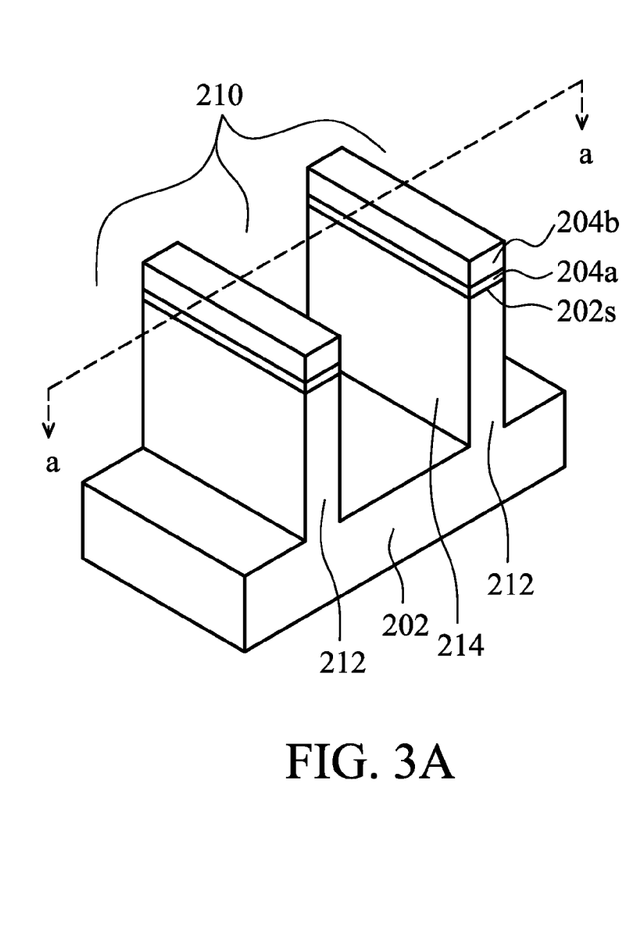
Figure 3B:
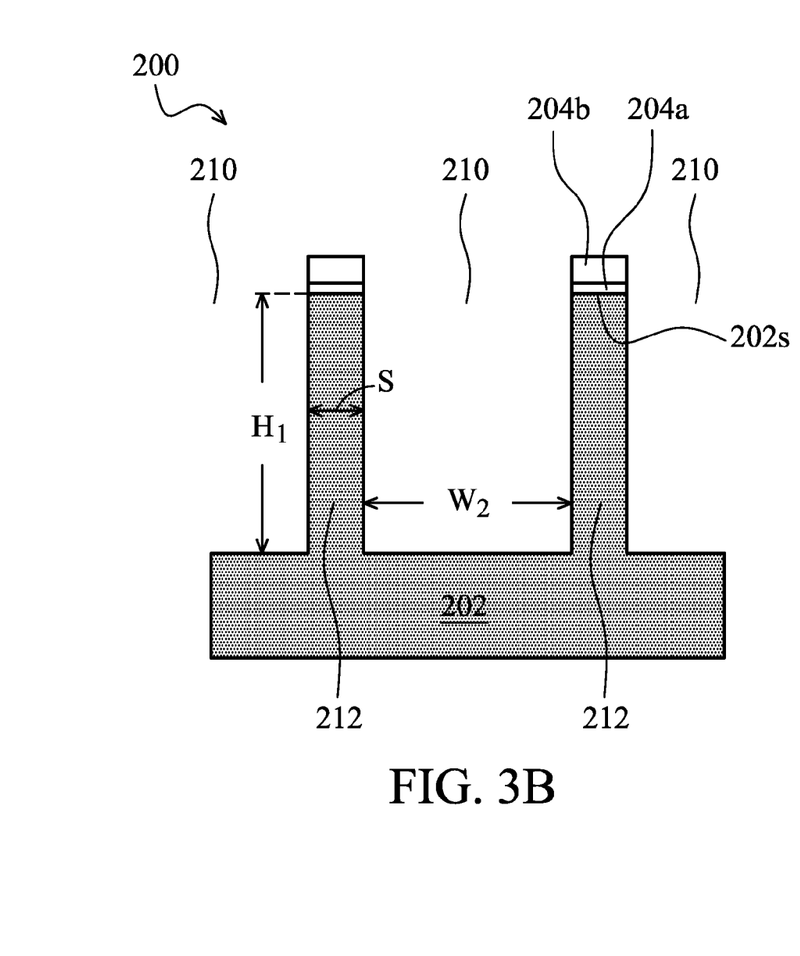

Referring to FIGS. 3A and 3B, after formation of the openings 208 in the photo-sensitive layer 206, the structure in FIGS. 3A and 3B is produced by forming a plurality of fins 212 in the substrate 202. FIG. 3A is a perspective view of the semiconductor device 200 at one of the various stages of fabrication according to an embodiment, and FIG. 3B is a cross-sectional view of semiconductor device 200 taken along the line a-a of FIG. 3A. The mask layer 204b and pad layer 204a are etched through openings 208 to expose underlying semiconductor substrate 202. The exposed semiconductor substrate 202 is then etched to form trenches 210 lower than the major surface 202s of the semiconductor substrate 202. Portions of the semiconductor substrate 202 between trenches 210 form semiconductor fins 212.

In the depicted embodiment, the semiconductor fins 212 extend downward from the substrate major surface 202s to a first height $H_1$. Trenches 210 may be strips (viewed from in the top of the semiconductor 200) parallel to each other, and closely spaced with respect to each other. Trenches 210 each has a width W, the first height $H_1$, and is spaced apart from adjacent trenches by a spacing S. For example, the spacing S between trenches 210 may be smaller than about 30 nm. The photo-sensitive layer 206 is then removed. Next, a cleaning may be performed to remove a native oxide of the semiconductor substrate 202. The cleaning may be performed using diluted hydrofluoric (DHF) acid.

In some embodiments, the first height $H_1$ of the trenches 210 may range from about 2100 Å to about 2500 Å, while width W of the trenches 210 ranges from about 300 Å to about 1500 Å. In an exemplary embodiment, the aspect ratio (H/W) of the trenches 210 is greater than about 7.0. In some other embodiments, the aspect ratio may even be greater than about 8.0. In yet some embodiments, the aspect ratio is lower than about 7.0 or between 7.0 and 8.0. One skilled in the art will realize, however, that the dimensions and values recited throughout the descriptions are merely examples, and may be changed to suit different scales of integrated circuits.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

Figure 4A:
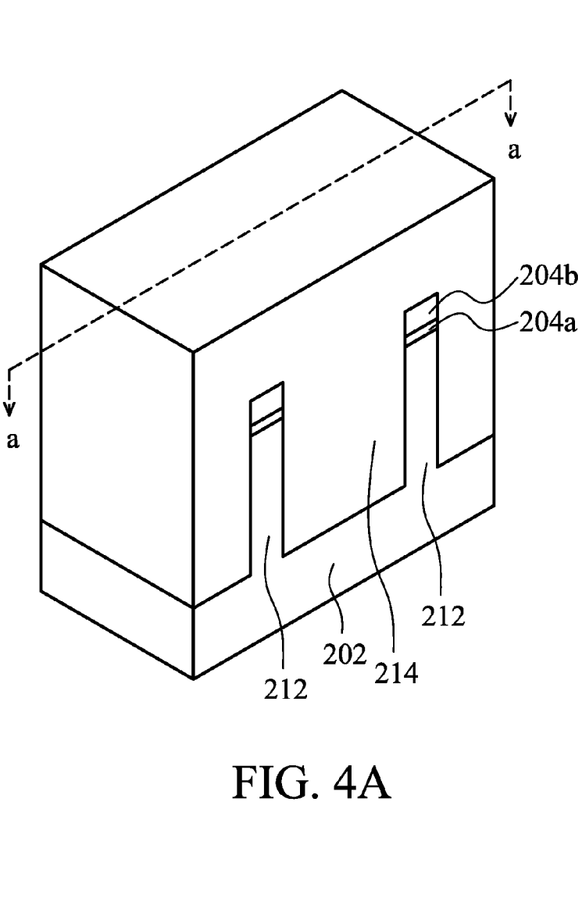
Figure 4B:
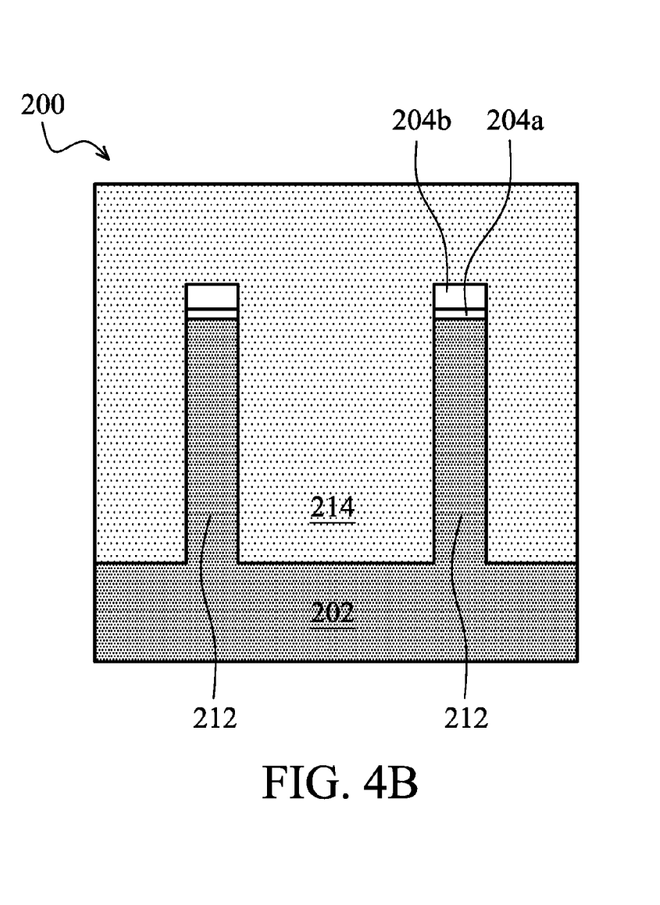

FIG. 4A is a perspective view of the semiconductor device 200 at one of the various stages of fabrication according to an embodiment, and FIG. 4B is a cross-sectional view of semiconductor device 200 taken along the line a-a of FIG. 4A. Trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In an embodiment, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

Figure 5A:
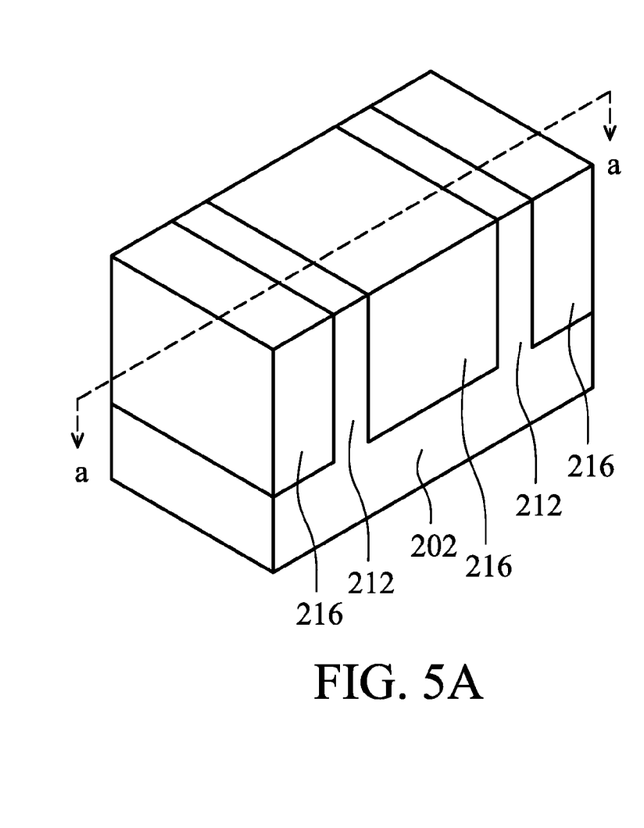
Figure 5B:
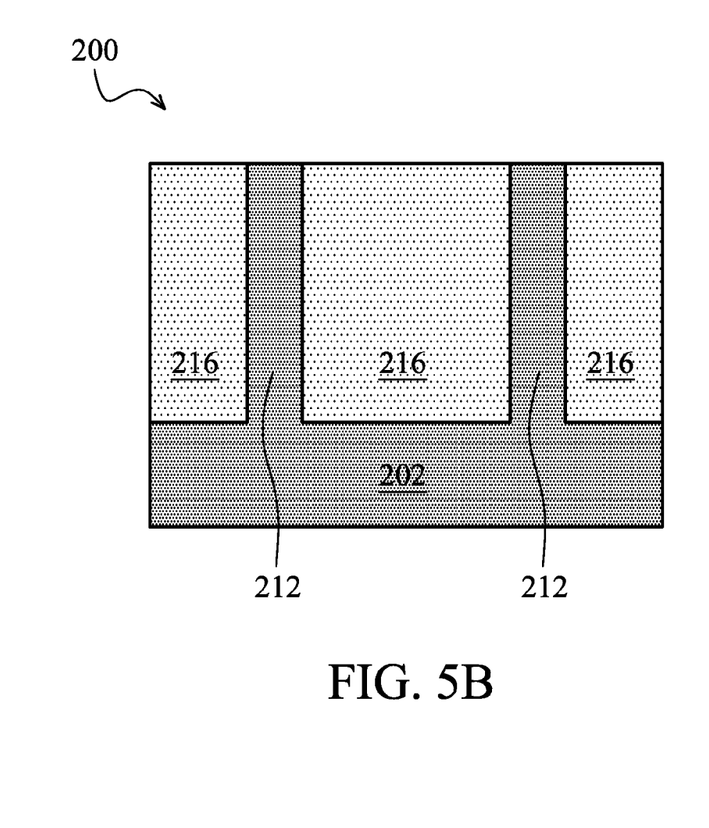

FIGS. 4A and 4B depict the resulting structure after the deposition of the dielectric material 214. A chemical mechanical polish is then performed, followed by the removal of the mask layer 204b and pad layer 204a. The resulting structure is shown in FIGS. 5A and 5B. FIG. 5A is a perspective view of the semiconductor device 200 at one of the various stages of fabrication according to an embodiment, and FIG. 5B is a cross-sectional view of semiconductor device 200 taken along the line a-a of FIG. 5A. The remaining portions of the oxide 214 in the trenches 210 are hereinafter referred to as insulation layers 216. In one embodiment, the mask layer 204b is formed of silicon nitride, and the mask layer 204b may be removed using a wet process using hot $H_3PO_4$, while pad layer 204a may be removed using diluted HF acid, if formed of silicon oxide. In some alternative embodiments, the removal of the mask layer 204b and pad layer 204a may be performed after the recessing of the insulation layers 216, which recessing step is shown in FIGS. 6A and 6B.

Figure 6A:
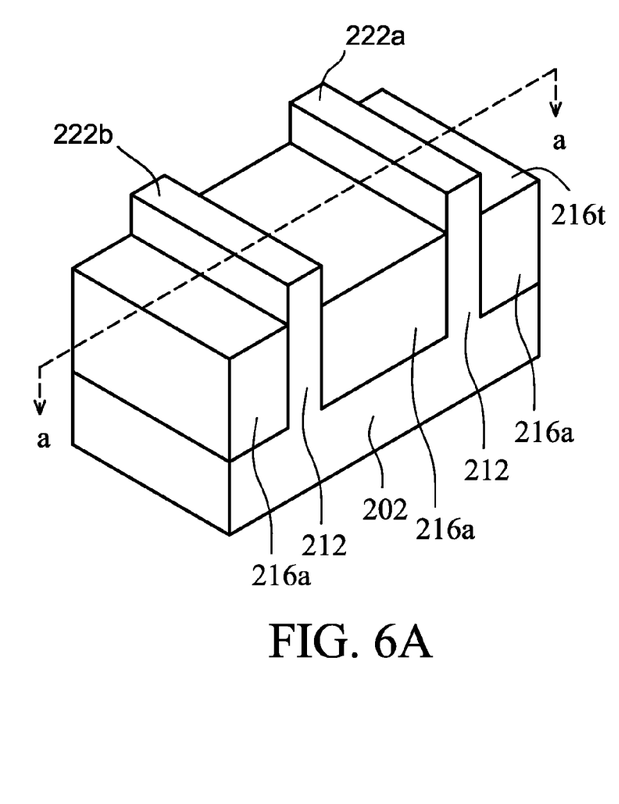
Figure 6B:
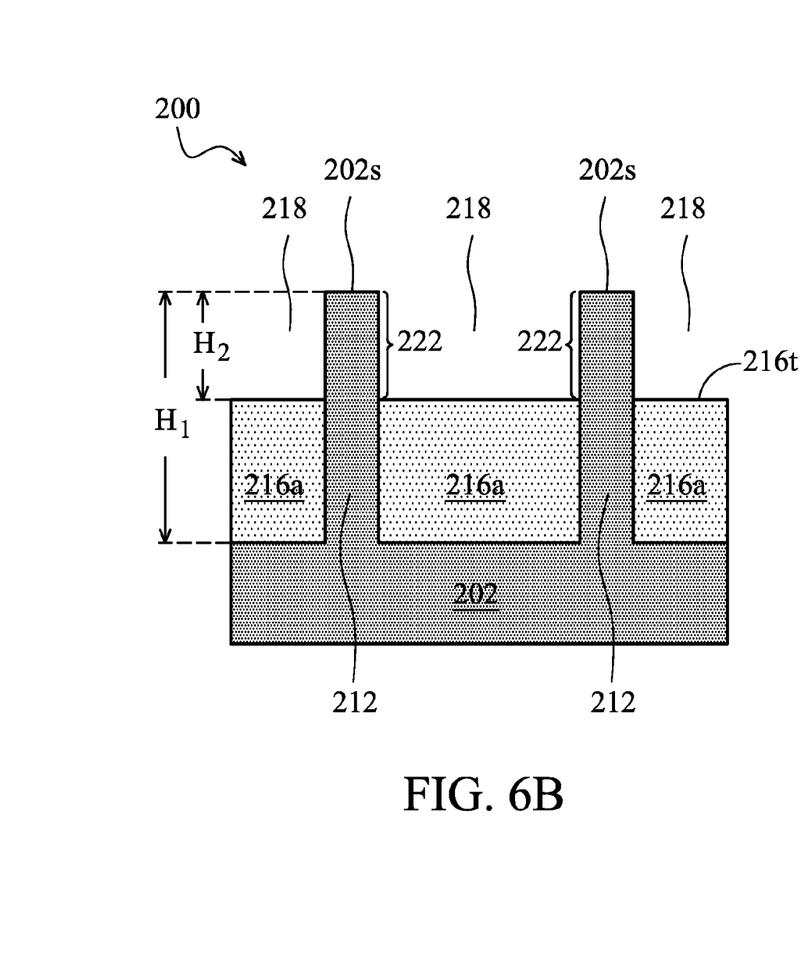

As shown in FIGS. 6A and 6B, after the removal of the mask layer 204b and pad layer 204a, the insulation layers 216 are recessed by an etching step, resulting in recesses 218 and a remaining insulation layer 216a comprising a top surface 216t. FIG. 6A is a perspective view of the semiconductor device 200 at one of the various stages of fabrication according to an embodiment, and FIG. 6B is a cross-sectional view of semiconductor device 200 taken along the line a-a of FIG. 6A. In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

In the depicted embodiment, upper portions 222 of the fins 212 extend downward from the substrate major surface 202s to the top surface 216t to a second height $H_2$ less than the first height $H_1$, thereby extending beyond the top surface 216t of the insulation layer 216. In one embodiment, a ratio of the second height $H_2$ to the first height $H_1$ is from about 0.2 to about 0.5. The second height $H_2$ of the upper portion 222 of the fins 212 may be between 15 nm and about 50 nm, although it may also be greater or smaller. In the depicted embodiment, the upper portions 222 of the fins 212 may comprise channel portions 222a and source/drain (S/D) portions 222b. The channel portions 222a are used to form channel regions of the semiconductor device 200.

Figure 7A:
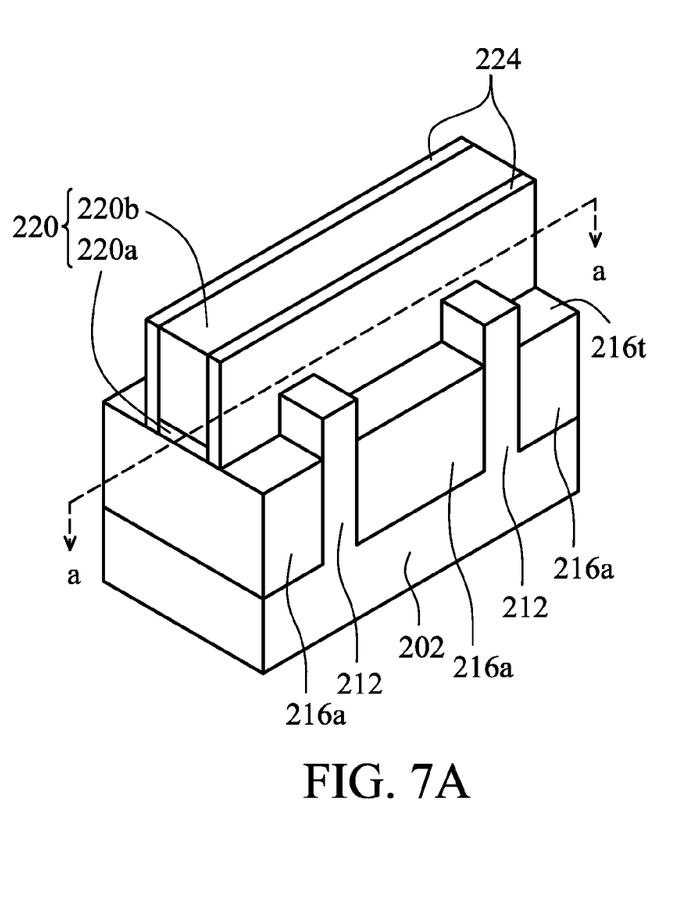
Figure 7B:
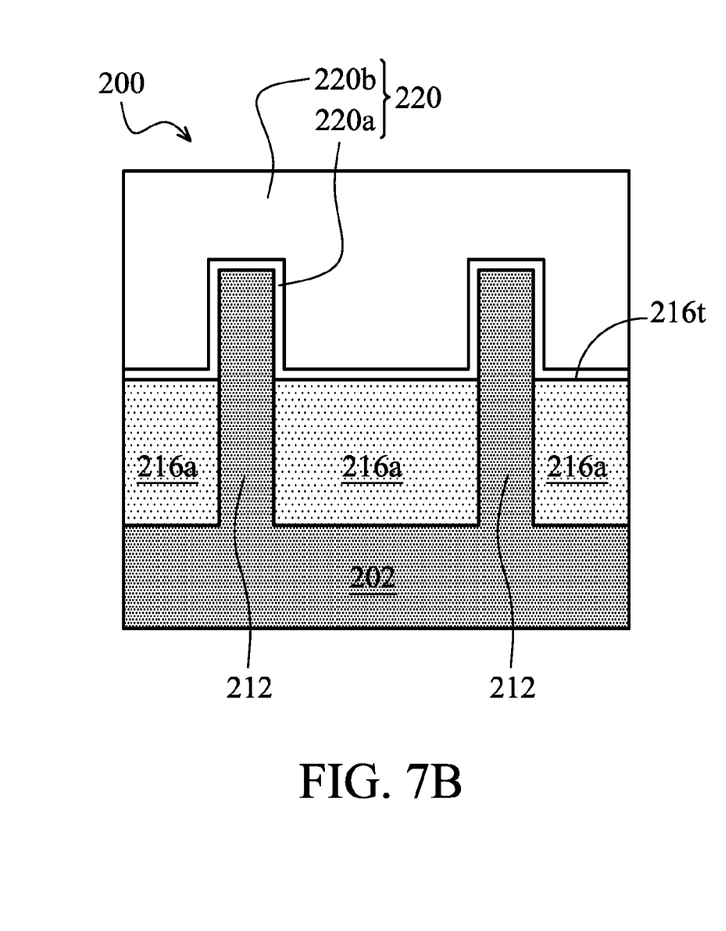

FIG. 7A is a perspective view of the semiconductor device 200 at one of the various stages of fabrication according to an embodiment, and FIG. 7B is a cross-sectional view of semiconductor device 200 taken along the line a-a of FIG. 7A. A gate stack 220 is formed over the channel portions 222a of the upper portion 222 of the fins 212 and extending to the top surface 216t of the insulation layer 216a. In some embodiments, the gate stack 220 typically comprises a gate dielectric layer 220a and a gate electrode layer 220b over the gate dielectric layer 220a.

In FIGS. 7A and 7B, a gate dielectric 220a is formed to cover the channel portions 222a of the upper portion 222 of the fins 212. In some embodiments, the gate dielectric layer 220a may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 220a is a high-k dielectric layer with a thickness in the range of about 10 to 30 angstroms. The gate dielectric layer 220a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 220a may further comprise an interfacial layer (not shown) to reduce damage between the gate dielectric layer 220a and channel portions 222a of the upper portions 222 of the fins 212. The interfacial layer may comprise silicon oxide.

The gate electrode layer 220b is then formed on the gate dielectric layer 220a. In one embodiment, the gate electrode layer 220b covers the upper portions 222 of more than one semiconductor fin 212, so that the resulting semiconductor device 200 comprises more than one fin. In some alternative embodiments, each of the upper portions 222 of the semiconductor fins 212 may be used to form a separate semiconductor device 200. In some embodiments, the gate electrode layer 220b may comprise a single layer or multilayer structure. In the present embodiment, the gate electrode layer 220b may comprise poly-silicon. Further, the gate electrode layer 220b may be doped poly-silicon with the uniform or non-uniform doping. In some alternative embodiments, the gate electrode layer 220b may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220b comprises a thickness in the range of about 30 nm to about 60 nm. The gate electrode layer 220b may be formed using a suitable process such as ALD, CVD, PVD, plating, or combinations thereof.

Still referring to FIG. 7A, the semiconductor device 200 further comprises a dielectric layer 224 formed over the substrate 202 and along the side of the gate stack 220. In some embodiments, the dielectric layer 224 may include silicon oxide, silicon nitride, silicon oxy-nitride, or other suitable material. The dielectric layer 224 may comprise a single layer or multilayer structure. A blanket layer of the dielectric layer 224 may be formed by CVD, PVD, ALD, or other suitable technique. Then, an anisotropic etching is performed on the dielectric layer 224 to form a pair of spacers on two sides of the gate stack 220. The dielectric layer 224 comprises a thickness ranging from about 5 to 15 nm.

Figure 8A:
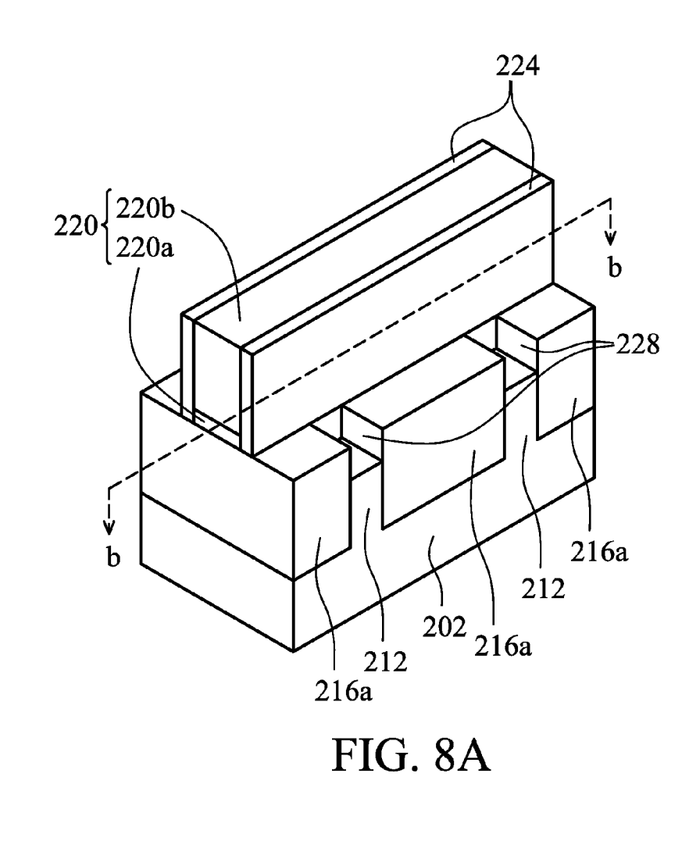
Figure 8B:
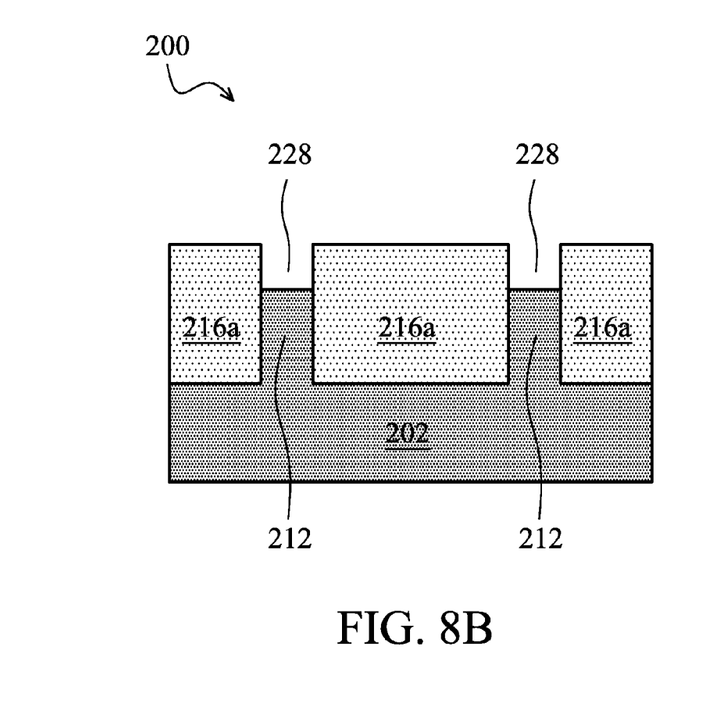

FIG. 8A is a perspective view of the semiconductor device 200 at one of the various stages of fabrication according to an embodiment, and FIG. 8B is a cross-sectional view of semiconductor device 200 taken along the line b-b of FIG. 8A. Using the gate stack 220 and the dielectric layer 224 as hard masks, a biased etching process is performed to recess the S/D portions 222b of the upper portions 222 of the fins 212 that are unprotected or exposed to form the S/D cavities 228 below the major surface 202s. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

Figure 9A:
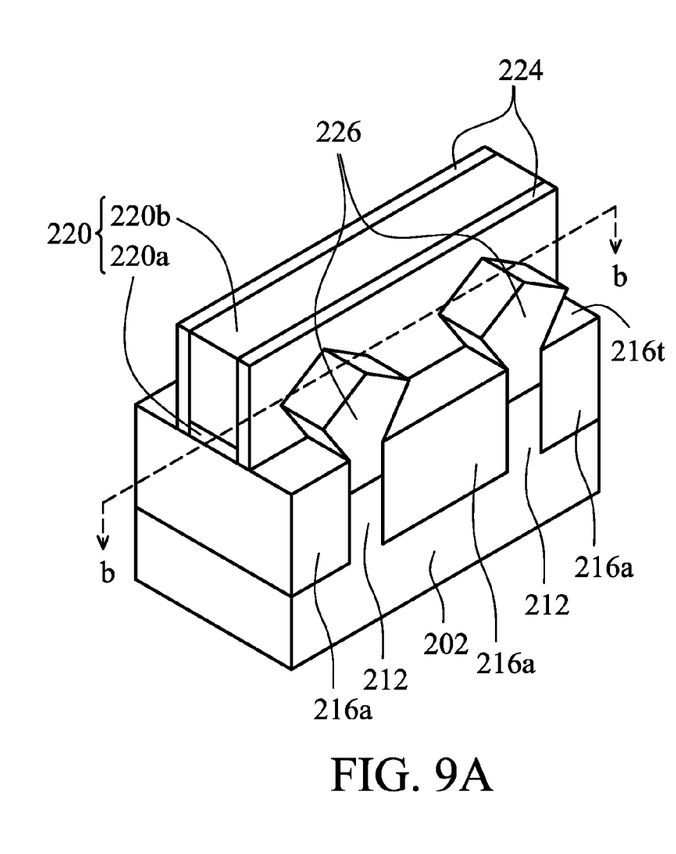
Figure 9B:
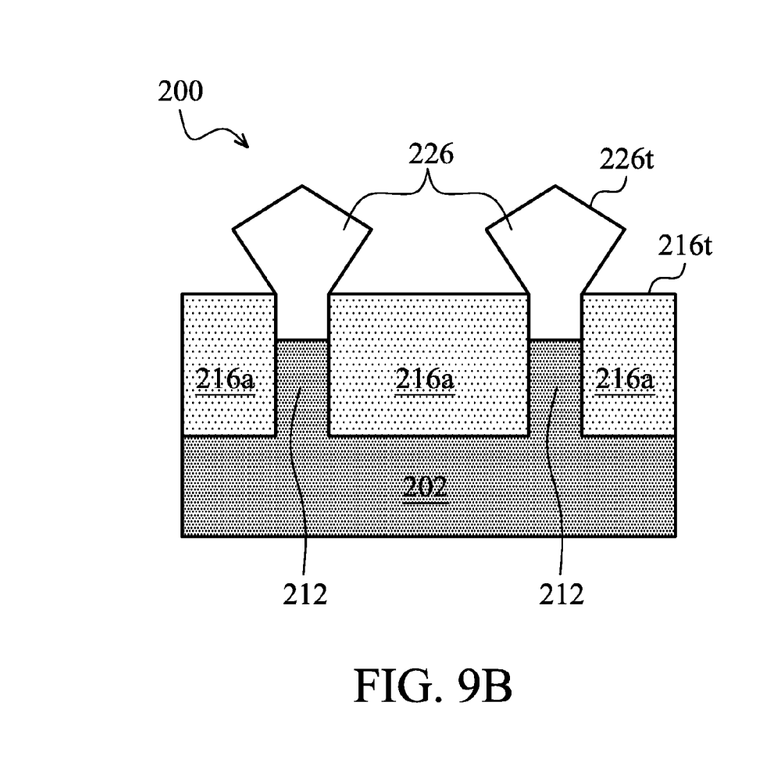

Referring to FIGS. 9A and 9B, and step 104 in FIG. 1, after the formation of the S/D cavities 228 in the S/D portions 222b, the structure in FIGS. 9A and 9B is produced by epi-growing a strained material 226 in the S/D cavities 228, wherein a lattice constant of the strained material 226 is different from a lattice constant of the substrate 202. FIG. 9A is a perspective view of the semiconductor device 200 at one of the various stages of fabrication according to an embodiment, and FIG. 9B is a cross-sectional view of semiconductor device 200 taken along the line b-b of FIG. 9A. In the depicted embodiment, a top surface 226t of the strained material 226 is higher than the top surface 216t. In some embodiments, the strained material 226 comprises SiGe or SiGeB for a p-type metal oxide semiconductor field effect transistor (pMOSFET).

In the depicted embodiment, a pre-cleaning process may be performed to clean the S/D cavities 228 with HF or other suitable solution. Then, the strained material 226 such as silicon germanium (SiGe) is selectively grown by an LPCVD process to fill the S/D cavities 228. In one embodiment, the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases.

The process steps up to this point have provided the substrate 202 having the strained material 226 in the S/D cavities 228. Conventionally, silicide regions over the strained material 226 may be formed by blanket depositing a thin layer of metal material, such as nickel, titanium, cobalt, and combinations thereof. The substrate 202 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide. However, Fermi level pinning between the metal silicide and strained material 226 results in a fixed Schottky barrier height (SBH). This fixed SBH causes high contact resistance of S/D regions of the semiconductor device and thus degrades the device performance.

Accordingly, the processing discussed below with reference to FIGS. 10-12 may form a contact structure comprising a Ge-containing dielectric layer to replace the silicide regions. The Ge-containing dielectric layer may serve as a low-resistance intermediate layer to replace high-resistance metal silicide. As such, the contact structure may provide low contact resistance of S/D regions of the semiconductor device, thereby enhancing the device performance.

Figure 10:
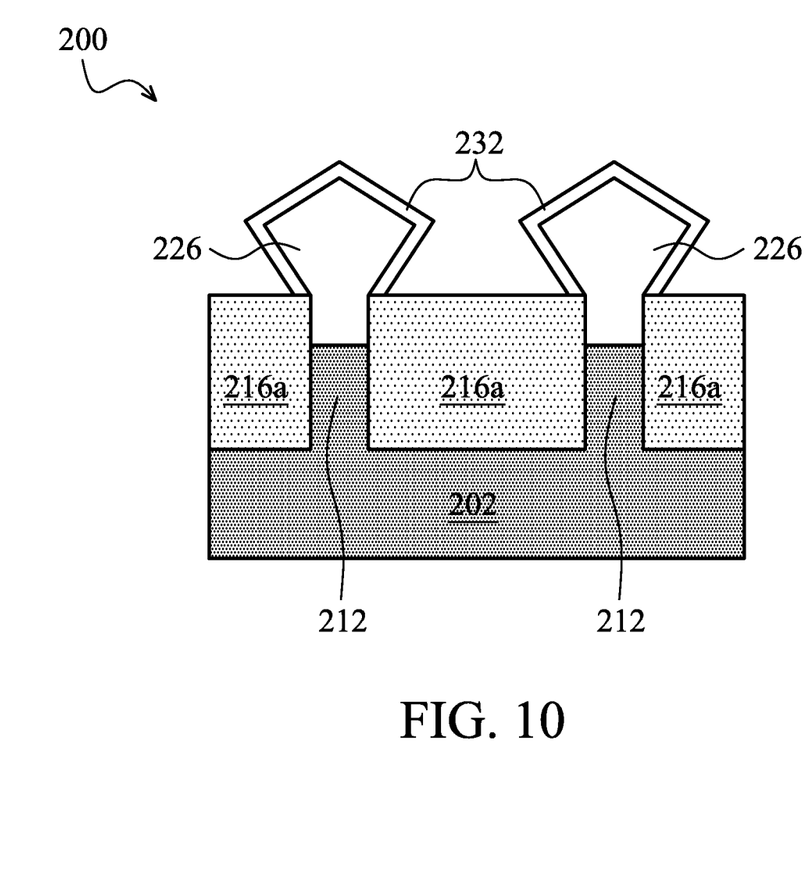

As depicted in FIG. 10 and step 106 in FIG. 1, for fabricating a contact structure (such as a contact structure 230 shown in FIG. 12) of the semiconductor device 200, the structure in FIG. 10 is produced by epi-growing a Ge layer 232 over the strained material 226. FIG. 10 is a cross-sectional view of semiconductor device 200 taken along the line b-b of FIG. 9A at one of the various stages of fabrication according to an embodiment. In some embodiments, the Ge layer 232 has a thickness ranging from about 1 nm to about 10 nm In some embodiments, the step for fabricating the contact structure 230 further comprises trimming the strained material 226 before epi-growing the Ge layer 232 to avoid merging between adjacent Ge layers 232. In some embodiments, the step of trimming the strained material 226 is performed using HCl as an etching gas.

In one embodiment, the Ge epitaxial process may be performed under a pressure of about 10 mTorr to 100 mTorr, at a temperature of about 350° C. to 450° C., using GeH$_4$, GeH$_3$CH$_3$, and/or (GeH$_3$)$_2$CH$_2$ as epitaxial gases. Optionally, an anneal process after the epitaxial process is performed at a temperature of about 550° C. to 750° C. to confine dislocation defects on the interface of the strained material 226 and Ge epitaxial layer 232.

Figure 11:
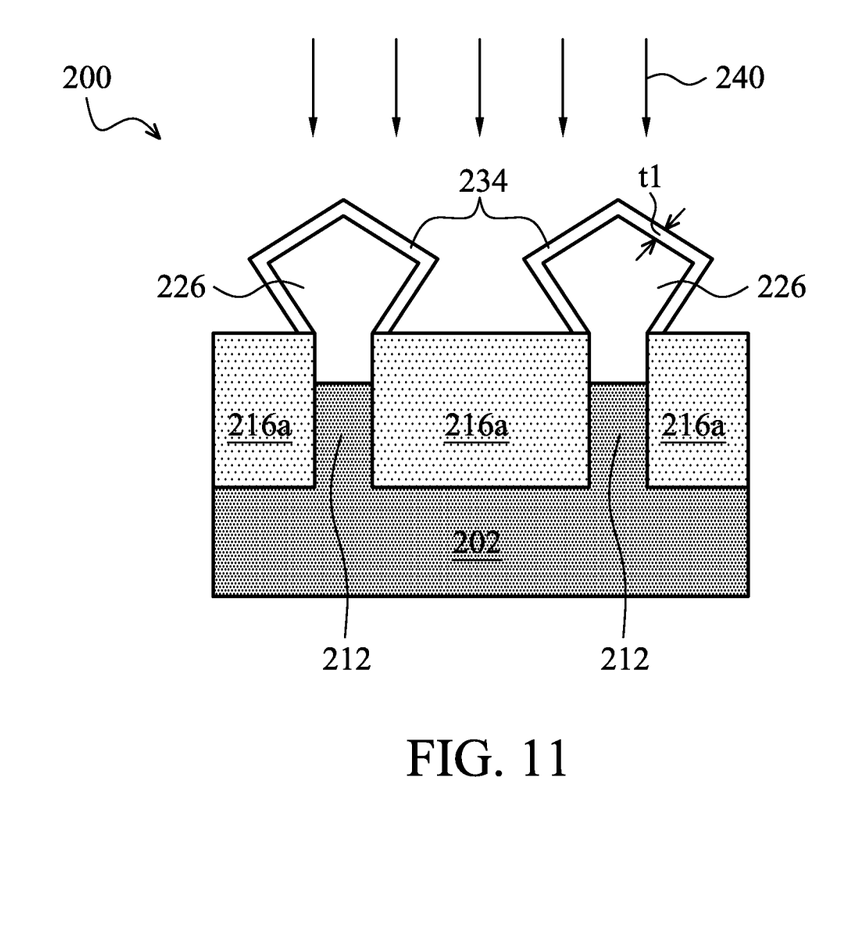

FIG. 11 is a cross-sectional view of semiconductor device 200 taken along the line b-b of FIG. 9A at one of the various stages of fabrication according to an embodiment. Then, the structure depicted in FIG. 11 is produced by treating 240 the Ge layer 232 to form a Ge-containing dielectric layer 234 over the strained material 226 (step 108 in FIG. 1). In some embodiments, the Ge-containing dielectric layer 234 comprises GeN$_x$, GeO$_x$ or GeO$_x$N$_y$. In some embodiments, the Ge-containing dielectric layer 234 has a first thickness t$_1$ ranging from about 1 nm to about 10 nm.

In some embodiments, the step of treating 240 the Ge layer 232 to form a Ge-containing dielectric layer 234 over the strained material 226 is performed by thermal nitridation or thermal oxidation, exposing a surface of the Ge layer 232 to a vapor comprising N$_2$, NH$_3$, H$_2$O, O$_2$, or O$_3$. In some embodiments, the step of treating 240 the Ge layer 232 to form a Ge-containing dielectric layer 234 over the strained material 226 is performed by plasma doping or ion implantation, using N$_2$ and/or O$_2$ as a doping gas. The doping concentration is between about 10$^{15}$ to about 10$^{22}$ atoms/cm$^3$. Then, the structure depicted in FIG. 11 is produced by annealing the substrate 202 to convert the doped Ge layer 232 to the Ge-containing dielectric layer 234. In the depicted embodiment, the Ge-containing dielectric layer 234 may reduce the fixed SBH and serve as a low-resistance layer to replace high-resistance metal silicide, thereby enhancing the device performance.

Figure 12:
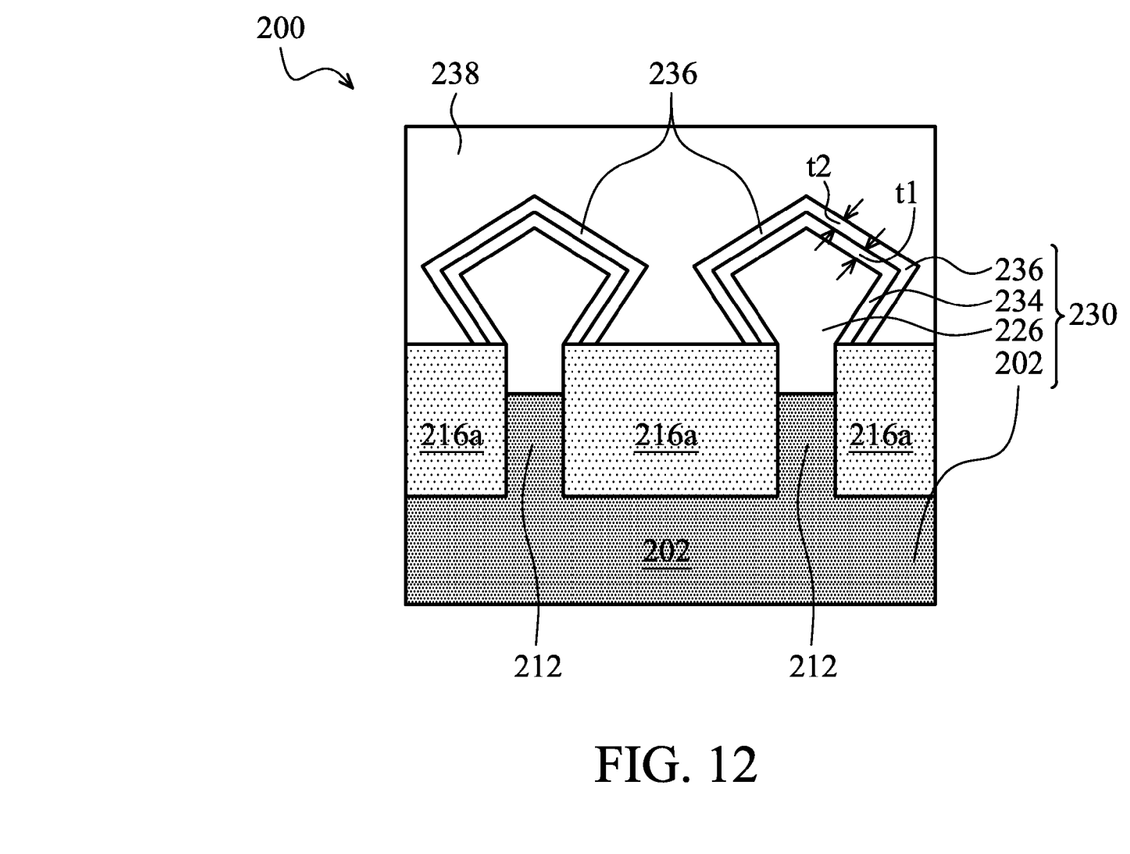

FIG. 12 is a cross-sectional view of semiconductor device 200 taken along the line b-b of FIG. 9A at one of the various stages of fabrication according to an embodiment. Referring to FIG. 12, after formation of the Ge-containing dielectric layer 234, a first metal layer 236 is formed over the Ge-containing dielectric layer 234 (step 110 in FIG. 1) to a second thickness t$_2$ ranging from about 5 nm to about 10 nm. In some embodiments, the first metal layer 236 comprises Co, Ni, or TiN. The first metal layer 236 may be formed by CVD, ALD, or sputtering. In the depicted embodiment, the first metal layer 236, the Ge-containing dielectric layer 234, the strained material 226, and the substrate 202 are combined and referred to as a contact structure 230 of the semiconductor device 200.

Then, a second metal layer 238 is formed over the first metal layer 236. In the depicted embodiment, the second metal layer 238 comprises Al, Cu, or W. In some embodiments, the second metal layer 238 may be formed by CVD, PVD, ALD, or other suitable technique. After the steps shown in FIG. 1, as further illustrated with respect to the example depicted in FIGS. 2A-12, have been performed, subsequent processes, comprising interconnect processing, are typically performed to complete the semiconductor device 200 fabrication.

In accordance with one embodiment, a contact structure for a semiconductor device comprises a substrate comprising a major surface and a cavity below the major surface; a strained material in the cavity, wherein a lattice constant of the strained material is different from a lattice constant of the substrate; a Ge-containing dielectric layer over the strained material; and a metal layer over the Ge-containing dielectric layer.

In accordance with another embodiment, a p-type metal oxide semiconductor field effect transistor (pMOSFET) comprises a substrate comprising a major surface and a cavity below the major surface; a gate stack on the major surface of the substrate; a shallow trench isolations (STI) region disposed on one side of the gate stack, wherein the STI region is within the substrate; and a contact structure distributed between the gate stack and the STI, wherein the contact structure comprises a strained material in the cavity, wherein a lattice constant of the strained material is different from a lattice constant of the substrate; a Ge-containing dielectric layer over the strained material; and a metal layer over the Ge-containing dielectric layer.

In accordance with another embodiments, a method of fabricating a semiconductor device comprises providing a substrate comprising a major surface and a cavity below the major surface; epi-growing a strained material in the cavity, wherein a lattice constant of the strained material is different from a lattice constant of the substrate; epi-growing a Ge layer over the strained material; treating the Ge layer to form a Ge-containing dielectric layer over the strained material; and forming a metal layer over the Ge-containing dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact structure for a semiconductor device comprising:
a substrate comprising a major surface and a cavity below the major surface;
a strained material in the cavity and protruding above the major surface of the substrate, wherein a lattice constant of the strained material is different from a lattice constant of the substrate;
a Ge-containing dielectric layer over the strained material, the Ge-containing dielectric layer having a substantially uniform thickness;
a first metal layer over the Ge-containing dielectric layer, the first metal layer having a substantially uniform thickness; and
a second metal layer over the first metal layer, the second metal layer having a different material composition than the first metal layer, the second metal layer having a bottom surface directly adjoining the major surface of the substrate.

2. The contact structure of claim 1, wherein the strained material comprises SiGe or SiGeB.

3. The contact structure of claim 1, wherein the Ge-containing dielectric layer has a thickness ranging from about 1 nm to about 10 nm.

4. The contact structure of claim 1, wherein the Ge-containing dielectric layer comprises GeN$_x$.

5. The contact structure of claim 1, wherein the Ge-containing dielectric layer comprises GeO$_x$ or GeO$_x$N$_y$.

6. The contact structure of claim 1, wherein the first metal layer comprises Co, Ni, or TiN.

7. The contact structure of claim 1, wherein the first metal layer has a thickness ranging from about 5 nm to about 10 nm.

8. The contact structure of claim 1 further comprising a shallow trench isolation (STI) region in the substrate, wherein the second metal layer directly adjoins a surface of the STI region.

9. A p-type metal oxide semiconductor field effect transistor (pMOSFET) comprising:
- a substrate comprising a major surface and a cavity below the major surface;
- a gate stack on the major surface of the substrate;
- a shallow trench isolation (STI) region disposed on one side of the gate stack, wherein the STI region is within the substrate; and
- a contact structure distributed between the gate stack and the STI, wherein the contact structure comprises:
  - a strained material in the cavity, wherein a lattice constant of the strained material is different from a lattice constant of the substrate;
  - a Ge-containing dielectric layer over the strained material;
  - a first metal layer over the Ge-containing dielectric layer; and
  - a second metal layer over the first metal layer, wherein the second metal layer directly adjoins the STI region.

10. The pMOSFET of claim 9, wherein the strained material comprises SiGe or SiGeB.

11. The pMOSFET of claim 9, wherein the Ge-containing dielectric layer has a thickness ranging from about 1 nm to about 10 nm.

12. The pMOSFET of claim 9, wherein the Ge-containing dielectric layer comprises $GeN_x$.

13. The pMOSFET of claim 9, wherein the Ge-containing dielectric layer comprises $GeO_x$ or $GeO_xN_y$.

14. The pMOSFET of claim 9, wherein the first metal layer comprises Co, Ni, or TiN.

15. The pMOSFET of claim 9, wherein the first metal layer has a thickness ranging from about 5 nm to about 10 nm.

16. A semiconductor device comprising:
- a first semiconductor fin extending above a substrate;
- a first strained material in a recess of the first semiconductor fin, the first strained material having a different lattice constant than a lattice constant of the first semiconductor fin;
- a first Ge-containing dielectric layer over the first strained material;
- a first metal layer over the first Ge-containing dielectric layer;
- a second semiconductor fin extending above the substrate, the second semiconductor fin adjacent the first semiconductor fin;
- a second strained material in a recess of the second semiconductor fin, the second strained material having a different lattice constant than a lattice constant of the second semiconductor fin;
- a second Ge-containing dielectric layer over the second strained material;
- a second metal layer over the second Ge-containing dielectric layer;
- a third metal layer over the first metal layer and the second metal layer, a portion of the third metal layer extending between the first strained material and the second strained material; and
- a shallow trench isolation (STI) region in the substrate, wherein the third metal layer directly adjoins a surface of the STI region.

17. The semiconductor device of claim 16, wherein the first Ge-containing dielectric layer has a substantially uniform thickness over the first strained material, and wherein the first metal layer has a substantially uniform thickness over the first Ge-containing dielectric layer.

18. The semiconductor device of claim 16, wherein the first Ge-containing dielectric layer comprises $GeO_x$ or $GeO_xN_y$.

19. The semiconductor device of claim 16, wherein the first metal layer and the second metal layer each comprise Co, Ni, or TiN.

20. The semiconductor device of claim 16, wherein the STI region contacts the first metal layer, the second metal layer, the first strained material, the second strained material, the first Ge-containing dielectric layer, and the second Ge-containing dielectric layer.

\* \* \* \* \*